(12) United States Patent
Katoch

(10) Patent No.: US 11,705,183 B2
(45) Date of Patent: Jul. 18, 2023

(54) WORD LINE BOOSTER CIRCUIT AND METHOD

(71) Applicant: TAIWAN SEMICONDUCTOR MANUFACTURING COMPANY, LTD., Hsinchu (TW)

(72) Inventor: Atul Katoch, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/223,548

(22) Filed: Apr. 6, 2021

(65) Prior Publication Data

US 2022/0068353 A1    Mar. 3, 2022

Related U.S. Application Data

(60) Provisional application No. 63/104,634, filed on Oct. 23, 2020, provisional application No. 63/071,512, filed on Aug. 28, 2020.

(51) Int. Cl.
*G11C 11/408* (2006.01)
*G11C 11/4074* (2006.01)
*G11C 11/4093* (2006.01)

(52) U.S. Cl.
CPC ...... *G11C 11/4085* (2013.01); *G11C 11/4074* (2013.01); *G11C 11/4087* (2013.01); *G11C 11/4093* (2013.01)

(58) Field of Classification Search
CPC ............ G11C 11/4085; G11C 11/4074; G11C 11/4087; G11C 11/4093; G11C 11/418; G11C 2207/2209; G11C 8/08; G11C 16/08; G11C 16/26; G11C 16/30
See application file for complete search history.

(56) References Cited

U.S. PATENT DOCUMENTS

| | | | |
|---|---|---|---|
| 6,078,531 A * | 6/2000 | Miyazima | G11C 8/08 365/233.5 |
| 9,355,697 B2 | 5/2016 | Earle et al. | |
| 2013/0088913 A1* | 4/2013 | Liu | G11C 11/413 365/194 |
| 2019/0130970 A1* | 5/2019 | Carissimi | G11C 13/0069 |
| 2020/0075089 A1 | 3/2020 | Hong | |
| 2020/0126605 A1 | 4/2020 | Hong | |

FOREIGN PATENT DOCUMENTS

| | | |
|---|---|---|
| CN | 109841251 | 6/2019 |
| JP | H06215567 A * | 5/1994 |
| TW | 202001904 | 1/2020 |

OTHER PUBLICATIONS

Office Action dated Jul. 11, 2022 for corresponding case No. TW 11120680340. (pp. 1-4).

* cited by examiner

*Primary Examiner* — Sultana Begum
(74) *Attorney, Agent, or Firm* — Hauptman Ham, LLP

(57) ABSTRACT

A memory circuit includes a plurality of word lines, a word line driver coupled to the plurality of word lines, and a booster circuit coupled to the plurality of word lines. The word line driver is configured to output a first word line signal on a first word line of the plurality of word lines, and the booster circuit includes a first node configured to carry a first power supply voltage and is configured to couple the first word line of the plurality of word lines to the first node responsive to a pulse signal and the first word line signal.

20 Claims, 8 Drawing Sheets

500

| A<1> | A<0> | CKP_WL<4> | CKP_WL<3> | CKP_WL<2> | CKP_WL<1> |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

| A<7> A<4> | A<6> A<3> | A<5> A<2> | XB<7> XA<7> | XB<6> XA<6> | XB<5> XA<5> | XB<4> XA<4> | XB<3> XA<3> | XB<2> XA<2> | XB<1> XA<1> | XB<0> XA<0> |
|---|---|---|---|---|---|---|---|---|---|---|
| 0 | 0 | 0 | 0 | 0 | 0 | 0 | 0 | 0 | 0 | 1 |
| 0 | 0 | 1 | 0 | 0 | 0 | 0 | 0 | 0 | 1 | 0 |
| 0 | 1 | 0 | 0 | 0 | 0 | 0 | 0 | 1 | 0 | 0 |
| 0 | 1 | 1 | 0 | 0 | 0 | 0 | 1 | 0 | 0 | 0 |
| 1 | 0 | 0 | 0 | 0 | 0 | 1 | 0 | 0 | 0 | 0 |
| 1 | 0 | 1 | 0 | 0 | 1 | 0 | 0 | 0 | 0 | 0 |
| 1 | 1 | 0 | 0 | 1 | 0 | 0 | 0 | 0 | 0 | 0 |
| 1 | 1 | 1 | 1 | 0 | 0 | 0 | 0 | 0 | 0 | 0 |

FIG. 5

WORD LINE BOOSTER CIRCUIT AND METHOD

PRIORITY CLAIM

The present application claims the priority of each of U.S. Provisional Application No. 63/071,512, filed Aug. 28, 2020, and U.S. Provisional Application No. 63/104,634, filed Oct. 23, 2020, each of which is incorporated herein by reference in its entirety.

BACKGROUND

Memory array data access includes read and write operations that are influenced by integrated circuit (IC) characteristics such as parasitic resistance and capacitance levels, operating voltages, and temperature and manufacturing process variations. The influence of these characteristics often relates to the speeds at which data are accessed and power is consumed during read and write operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a diagram of an address decoding scheme, in accordance with some embodiments.

DETAILED DESCRIPTION

Figure 1:
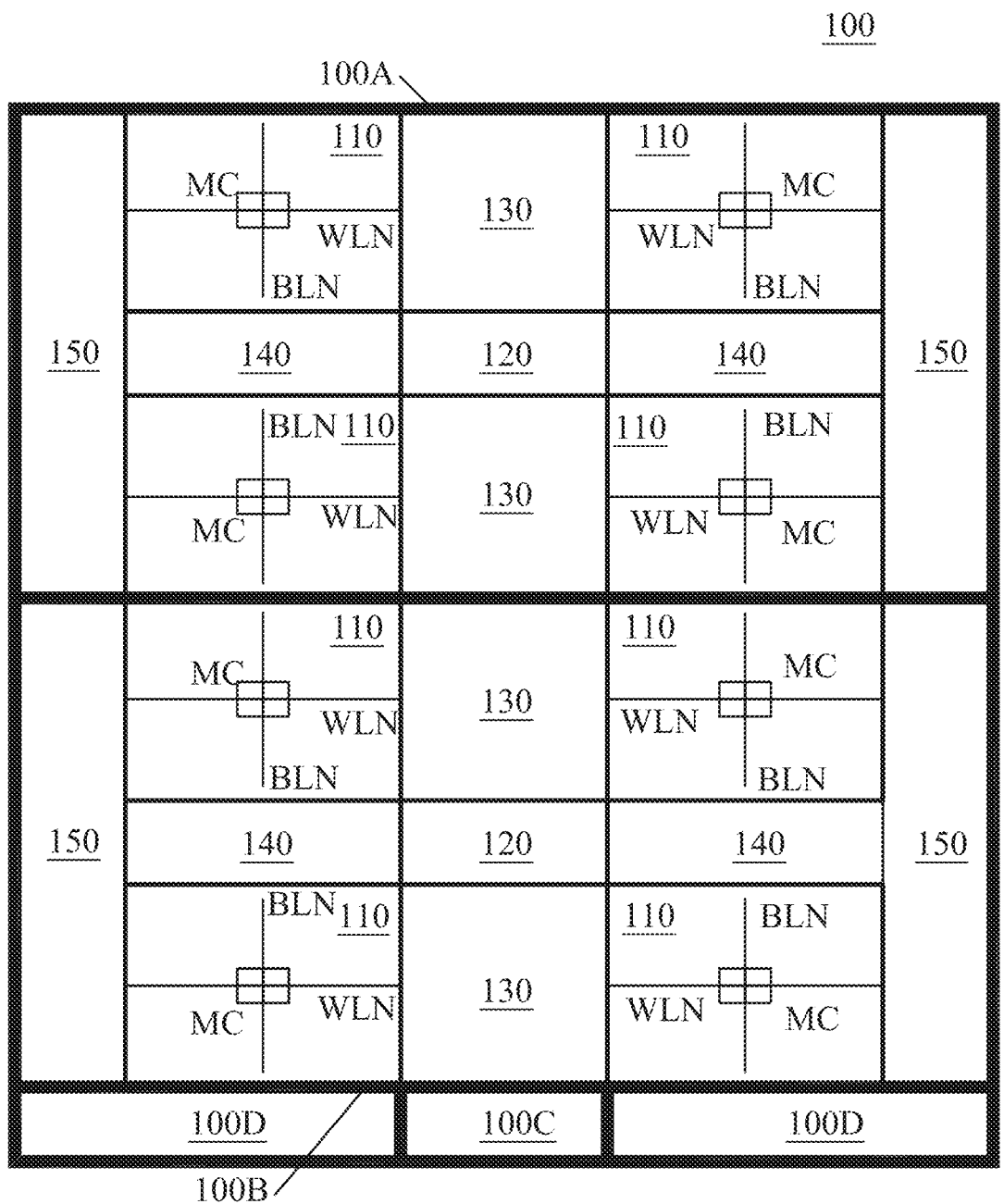
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit including a word line booster circuit is capable of generating word line signals having shorter rise and fall times compared to approaches in which a memory circuit does not include a word line booster circuit. In some embodiments, by using a clock pulse signal to boost the word line signals, corresponding word lines are capable of including a single metal layer, thereby improving routing flexibility compared to approaches in which a memory circuit does not include a word line booster circuit and word lines include multiple metal layers.

FIG. 1 is a diagram of a memory circuit 100, in accordance with some embodiments. Memory circuit 100 is an IC that includes memory banks 100A and 100B, a global control circuit 100C, and global input-output (I/O) circuits 100D. Each one of memory banks 100A and 100B includes one or more instances of an array 110, a local control circuit 120 coupled to one or more instances of each of a word line driver 130 and a local I/O circuit 140, and one or more instances of a booster circuit 150 coupled to an adjacent local I/O circuit 140. Each instance of array 110 is coupled to adjacent instances of each of word line driver 130, local I/O circuit 140, and booster circuit 150.

In the embodiment depicted in FIG. 1, each one of memory banks 100A and 100B includes four instances of array 110 including instances of memory cell MC coupled to a bit line BLN and a word line WLN, a representative instance of each depicted in FIG. 1. Each bit line BLN is coupled to the adjacent local I/O circuit 140, and each word line WLN is coupled to the adjacent word line driver 130 and adjacent booster circuit 150. In some embodiments, one or both of memory bank 100A or 100B includes fewer or greater than four instances of memory array 110.

In some embodiments, memory circuit 100 does not include one of memory banks 100A or 100B, includes one or more memory banks (not shown) in addition to memory banks 100A and 100B, or includes memory banks 100A and/or 100B having a configuration other than that depicted in FIG. 1, e.g., including a single instance of booster circuit 150.

Memory circuit 100 is simplified for the purpose of illustration. In various embodiments, memory circuit 100 includes various elements in addition to those depicted in FIG. 1 or is otherwise arranged so as to perform the operations discussed below.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

A memory cell MC is an electrical, electromechanical, electromagnetic, or other device configured to store bit data represented by logical states. The logical states of memory cells MC are capable of being programmed in a write operation and detected in a read operation. In some embodiments, a logical state corresponds to a voltage level of an electrical charge stored in a given memory cell MC. In some embodiments, a logical state corresponds to a physical property, e.g., a resistance or magnetic orientation, of a component of a given memory cell MC.

In some embodiments, a memory cell MC includes a static random-access memory (SRAM) cell. In various embodiments, an SRAM cell includes a five-transistor (5T) SRAM cell, a six-transistor (6T) SRAM cell, an eight-transistor (8T) SRAM cell, a nine-transistor (9T) SRAM cell, or an SRAM cell having other numbers of transistors. In some embodiments, a memory cell MC includes a dynamic random-access memory (DRAM) cell or other memory cell type capable of storing bit data.

A memory cell MC includes one or more selection transistors (not shown), each including a gate coupled to a corresponding word line WLN and a source/drain (S/D) terminal coupled to a corresponding bit line BLN, the memory cell MC thereby being configured to be selectively coupled to the corresponding bit line BLN responsive to a word line signal (not shown in FIG. 1) on the corresponding word line WLN. In the embodiment depicted in FIG. 1, each instance of memory cell MC is configured to be selectively coupled to a single instance of bit lines BLN responsive to a single instance of a word line signal, in operation. In some embodiments, at least one instance of memory cell MC is configured to be selectively coupled to more than one instance of bit line BLN responsive to one or more instances of a word line signal.

Global control circuit 100C is an electronic circuit configured to generate and receive one or more address, clock, clock pulse, control, and/or data signals (not shown) configured to control top-level operation of memory circuit 100. Each instance of global I/O circuit 100D is an electronic circuit configured to, responsive to one or more of the address, clock, clock pulse, control, and/or data signals, perform top-level I/O operations of memory circuit 100.

Each instance of local control circuit 120 is an electronic circuit configured to, responsive to one or more of the address, clock, clock pulse, control, and/or data signals, control operation of adjacent instances of local I/O circuit 140 and word line driver 130, thereby controlling operation of diagonally adjacent instances of array 110.

Each instance of local I/O circuit 140 and word line driver 130 is an electronic circuit configured to, responsive to one or more of the address, clock, clock pulse, control, and/or data signals, partially control operation of adjacent instances of array 110 whereby read and write operations are performed on the corresponding instances of memory cell MC.

Memory cells MC of each array 110 are grouped in words such that each memory cell MC of a given word is coupled to a single corresponding word line WLN, each array 110 thereby being configured such that read and write operations are performed simultaneously on the memory cells MC corresponding to a given word. In the embodiment depicted in FIG. 1, words of memory cells MC correspond to rows of each array 110, and word lines WLN are oriented horizontally. In some embodiments, one or more instances of memory bank 100A or 100B includes one or more instances of array 110 otherwise oriented such that read and write operations are performed simultaneously on the memory cells MC corresponding to a given word.

During read and write operations on a given word of memory cells MC, the adjacent word line driver 130 is configured to activate the corresponding word line WLN by generating the corresponding word line signal having one of a high or low logical state configured to couple each of the memory cells MC of the word to the one or more corresponding bit lines BLN. The adjacent word line driver 130 is configured to also deactivate the corresponding word line WLN by generating the word line signal having the other of the high or low logical state configured to decouple each of the memory cells MC of the word from the one or more corresponding bit lines BLN.

Each instance of booster circuit 150 is an electronic circuit configured to, responsive to a word line signal on an adjacent word line WLN and one or more of the address, clock, clock pulse, or control signals controlled by the adjacent local I/O circuit 140, in operation, couple the adjacent word line WLN to a node (not shown in FIG. 1) configured to have a voltage level corresponding to the high or low logical state of the corresponding word line signal. In the embodiment depicted in FIG. 1, each instance of booster circuit 150 is adjacent to multiple instances of array 110. In some embodiments, each instance of booster circuit 150 is adjacent to a single instance of array 110.

A word line and the gates of memory cells coupled to the word line, e.g., word line WLN and the gates of memory cells MC, have parasitic resistance and capacitance levels that increase rise and fall times of the corresponding word line signal as the resistance and capacitance levels increase. By the configuration discussed above, each word line WLN of memory circuit 100 is coupled to an adjacent word line driver 130 at a first end of the word line WLN and to an adjacent booster circuit 150 at a second end of the word line WLN opposite the first end. As further discussed below, a given word line WLN is thereby activated at each of the two ends in read and write operations such that the impact of the parasitic resistance and capacitance is reduced, and rise and fall times are decreased compared to approaches in which a memory circuit does not include a word line booster circuit.

In some embodiments, based on the reduced impact of the parasitic resistance and capacitance, each word line WLN includes one or more metal segments within a single metal layer of memory circuit 100, an entirety of each word line WLN thereby being positioned within the single metal layer of memory circuit 100. In such embodiments, memory circuit 100 including word lines WLN requires fewer routing resources than approaches in which word lines include at least one metal segment in each of multiple metal layers of a memory circuit.

Figure 2:
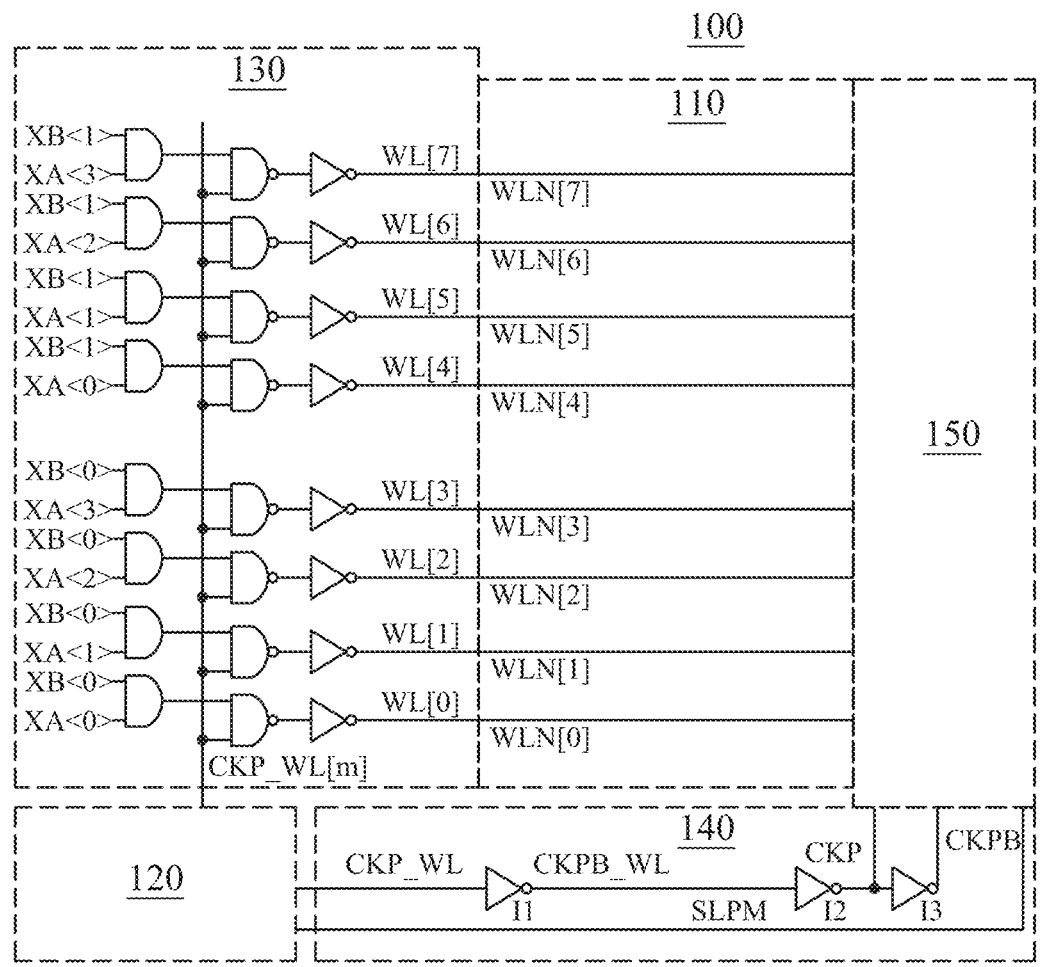
FIG. 2 is a diagram of a memory circuit, in accordance with some embodiments.

FIG. 2 is a diagram of a portion of memory circuit 100, in accordance with some embodiments. In a non-limiting example, FIG. 2 depicts one instance each of array 110, local control circuit 120, word line driver 130, local I/O circuit 140, and booster circuit 150, each discussed above with respect to FIG. 1. Instead of a single representative instance of word line WLN, FIG. 2 depicts representative word lines WLN[0]-WLN[7] configured to carry respective word line signals WL[0]-WL[7]. FIG. 2 also depicts elements of each of word line driver 130 and local I/O circuit 140 that are not depicted in FIG. 1.

FIG. 2 is simplified for the purpose of illustration, e.g., by omitting representative instances of memory cell MC and bit line BLN as depicted in FIG. 1. In various embodiments, each of array 110, local control circuit 120, word line driver 130, and local I/O circuit 140 includes one or more elements in addition to those depicted in FIG. 2. Details of booster circuit 150 are discussed below with respect to FIGS. 3A and 3B.

Local control circuit 120 and global control circuit 100C discussed above with respect to FIG. 1 are collectively configured to receive row addresses corresponding to word lines WLN, e.g., representative word lines WLN[0]-WLN [7], of array 110 and generate row decode and clock pulse signals having logical states based on the row addresses. In the embodiment depicted in FIG. 2, memory circuit 100 is configured to receive eight-bit row addresses corresponding to 256 rows and word lines WLN of array 110, and generate row decode signals XA<0>-XA<7> and XB<0>-XB<7> (represented by subset XA<0>-XA<3>, XB<0>, and XB<1>) and clock pulse signals CKP_WL[1]-CKP_WL[4], represented collectively as clock pulse signal CKP_WL[m]. In some embodiments, clock pulse signal CKP_WL[m] is referred to as a pulse signal CKP_WL[m]. In some embodiments, memory circuit 100 is configured to generate row decode signals XA<0>-XA<7> and XB<0>-XB<7 and clock pulse signals CKP_WL[1]-CKP_WL[4] using an address decoding scheme 500 discussed below with respect to FIG. 5.

In the embodiment depicted in FIG. 2, word line driver 130 includes plural AND gates, NAND gates, and inverters (not labeled). Each AND gate includes two input terminals and an output terminal. Each NAND gate includes an input terminal coupled to the output terminal of a corresponding AND gate, an input terminal coupled to local control circuit 120, and an output terminal. Each inverter includes an input terminal coupled to the output terminal of a corresponding NAND gate, and an output terminal coupled to a corresponding one of word lines WLN[0]-WLN[7], referred to generically as a word line WLN[n].

The input terminals of each AND gate are configured to receive corresponding pairs of row decode signals XA<0>-XA<7> and XB<0>-XB<7> from local control circuit 120, and the AND gate is thereby configured to generate a corresponding output signal (not labeled) at the output terminal having logical states responsive to the logical states of the corresponding pair of row decode signals XA<0>-XA<7> and XB<0>-XB<7>. The input terminals of each NAND gate are configured to receive a corresponding AND gate output signal and one of clock pulse signals CKP_WL[1]-CKP_WL[4], and the NAND gate is thereby configured to generate a corresponding word line bar signal (not labeled) at the output terminal having logical states and logical state transition timing responsive to the corresponding AND gate output signal and one of clock pulse signals CKP_WL[1]-CKP_WL[4]. The input terminal of each inverter is thereby configured to receive a corresponding word line bar signal, and the inverter is thereby configured to generate a corresponding word line signal WL[n], represented as word line signals WL[0]-WL[7] in FIG. 2, on a corresponding word line WLN[n] having logical states and logical state transition timing responsive to the corresponding word line bar signal.

Memory circuit 100 and word line driver 130 are thereby configured to generate each of word line signals WL[n] on corresponding word lines WLN[n] based on decode signals XA<0>-XA<7> and XB<0>-XB<7> and clock pulse signals CKP_WL[1]-CKP_WL[4] generated based on received row addresses. In some embodiments, memory circuit 100 and word line driver 130 are otherwise configured to generate each of word line signals WL[n] on corresponding word lines WLN[n] based on received row addresses, e.g., by including fewer or more than four clock pulse signals and/or including fewer or more than 256 rows and word lines WLN[n].

In the embodiment depicted in FIG. 2, local I/O circuit 140 includes inverters I1-I3. Inverter I1 includes an input terminal coupled to local control circuit 120. Inverter I2 includes an input terminal coupled to an output terminal of inverter I1 and an output terminal coupled to booster circuit 150. Inverter I3 includes an input terminal coupled to the output terminal of inverter I2 and an output terminal coupled to booster circuit 150. Local I/O circuit 140 also includes a signal line (not labeled) coupled to each of local control circuit 120 and booster circuit 150 and configured to propagate a signal SLPM discussed below with respect to FIGS. 3A and 3B.

Local I/O circuit 140 is thereby configured to receive a clock pulse signal CKP_WL from local control circuit 120 at the input terminal of inverter I1, generate a clock pulse signal CKPB_WL complementary to clock pulse signal CKP_WL at the output terminal of inverter I1, generate a clock pulse signal CKP complementary to clock pulse signal CKPB_WL at the output terminal of inverter I2, and generate a clock pulse signal CKPB complementary to clock pulse signal CKP at the output terminal of inverter I3.

Local control circuit 120 is configured to generate clock pulse signal CKP_WL having logical states corresponding to the collective logical states of clock pulse signals CKP_WL[m]. In the embodiment depicted in FIG. 2, local control circuit 120 is configured to generate clock pulse signal CKP_WL having a high logical state corresponding to any one or more of clock pulse signals CKP_WL[m] having the high logical state, and otherwise having a low logical state. In some embodiments, local control circuit 120 is configured to generate clock pulse signal CKP_WL having the low logical state corresponding to any one or more of clock pulse signals CKP_WL[m] having the low logical state, and otherwise having the high logical state.

As discussed below with respect to FIGS. 3A and 3B, memory circuit 100 and local I/O circuit 140 are thereby configured to generate clock pulse signals CKP and CKPB and signal SLPM usable by booster circuit 150 to boost each of word line signals WL[n] at one end of a corresponding word line WLN[n] responsive to word line driver 130 generating the word line signal WL[n] at the other end of the corresponding word line WLN[n] in a read or write operation. In some embodiments, memory circuit 100 and local I/O circuit 140 are otherwise configured, e.g., by omitting inverter I1 or including one or more inverters in addition to inverters I1-I3, so as to generate clock pulse signals CKP and CKPB and signal SLPM usable by booster circuit 150 to boost each of word line signals WL[n].

Figure 3A:
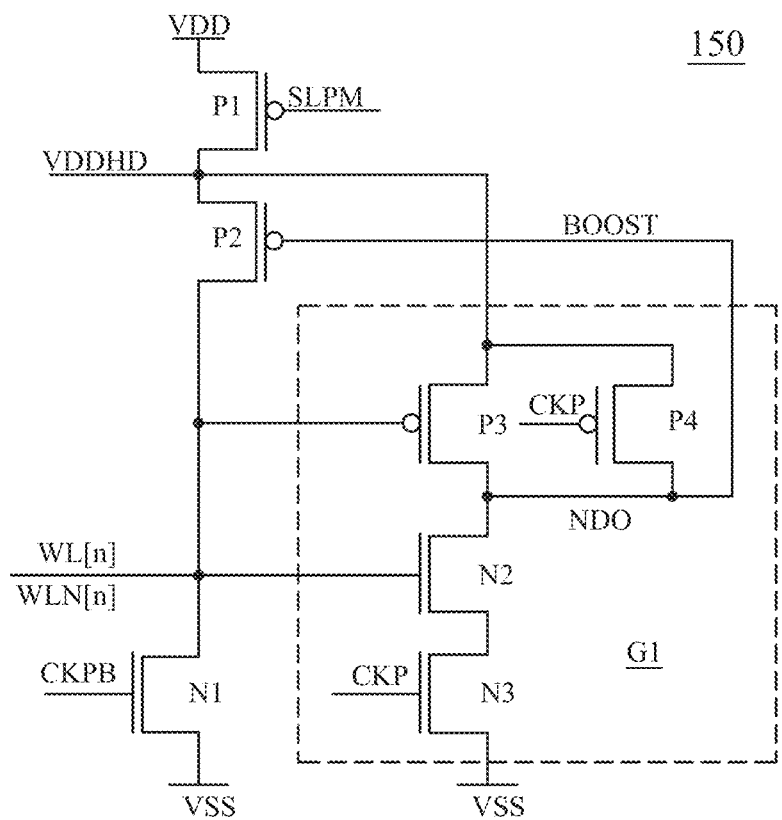
FIGS. 3A and 3B are diagrams of a word line booster circuit, in accordance with some embodiments.
Figure 3B:
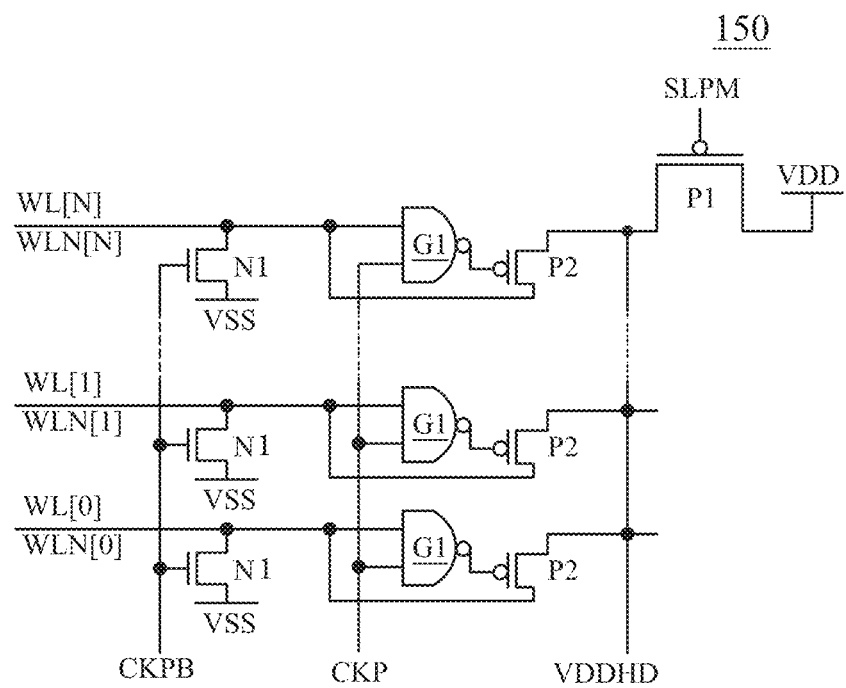

FIGS. 3A and 3B are diagrams of booster circuit 150, in accordance with some embodiments. FIG. 3A depicts elements of booster circuit 150 corresponding to a single instance of word line WLN[n], and FIG. 3B depicts elements of booster circuit 150 corresponding to a group of N+1 word lines WLN[0]-WLN[N], e.g., word lines WLN[0]-WLN[4] depicted in FIG. 2.

Each of FIGS. 3A and 3B includes a first power supply node configured to have a first power supply voltage, collectively represented as VDD, a second power supply node configured to have a second power supply voltage less than the first power supply voltage, collectively represented as VDDHD, and a reference node configured to have a reference voltage, e.g., ground, collectively represented as VSS. A PMOS transistor P1 is coupled between first and second power supply nodes VDD and VDDHD, and an NMOS transistor N1 is coupled between word line WLN[n] and reference node VSS.

FIG. 3A also includes a PMOS transistor P2 coupled between second power supply node VDDHD and word line WLN[n], a PMOS transistor P3 and NMOS transistors N2 and N3 coupled in series between second power supply node VDDHD and reference node VSS, and a PMOS transistor P4 coupled in parallel with PMOS transistor P3. A gate of PMOS transistor P2 and an S/D terminal of each of PMOS transistors P3 and P4 and NMOS transistor N2 are coupled to each other at a node NDO. A gate of each of PMOS transistor P3 and NMOS transistor N2 is coupled to word line WLN[n].

A gate of PMOS transistor P1 is configured to receive signal SLPM, a gate of NMOS transistor N1 is configured to receive clock pulse signal CKPB, gates of each of PMOS transistor P4 and NMOS transistor N3 are configured to receive clock pulse signal CKP, gates of PMOS transistor P3 and NMOS transistor N2 are thereby configured to receive word line signal WL[n], and the gate of PMOS transistor P2 is thereby configured to receive a signal BOOST from node NDO.

PMOS transistors P3 and P4 and NMOS transistors N2 and N3 are thereby configured as a NAND gate G1 including an input terminal configured to receive word line signal WL[n] from word line WLN[n], an input terminal configured to receive clock pulse signal CKP, and an output terminal corresponding to node NDO on which signal BOOST is generated having a logical state responsive the logical states of word line signal WL[n] and clock pulse signal CKP.

In operation, e.g., a read or write operation, NAND gate G1 is thereby configured to generate signal BOOST having the low logical state in response to each of word line signal WL[n] and clock pulse signal CKP having the high logical state, and otherwise having the high logical state. PMOS transistor P2 is thereby configured to selectively couple word line WLN[n] to power supply node VDDHD by switching on in response to signal BOOST having the low logical state, and to selectively decouple word line WLN[n] from power supply node VDDHD by switching off in response to signal BOOST having the high logical state.

NMOS transistor N1 is thereby configured to selectively couple word line WLN[n] to reference node VSS by switching on in response to clock pulse signal CKPB having the high logical state, and to selectively decouple word line WLN[n] from reference node VSS by switching off in response to clock pulse signal CKPB having the low logical state. Because clock pulse signal CKPB is complementary to clock pulse signal CKP, booster circuit 150 is thereby configured to selectively couple word line WLN[n] to power supply node VDDHD in response to clock pulse signal CKP having the low logical state only when word line WLN[n] is selectively decoupled from reference node VSS based on clock pulse signal CKPB having the low logical state.

By the configuration discussed above, booster circuit 150 is configured to activate an adjacent end of word line WLN[n] responsive to the corresponding word line signal WL[n] and clock pulse signal CKP received from local I/O circuit 140 and based on clock pulse signal CKP_WL, as further discussed below with respect to FIG. 4.

In the embodiment depicted in FIGS. 3A and 3B, memory circuit 100 is configured to generate signal SLPM, referred to as a power management signal SLPM in some embodiments, having the high logical state in a power saving mode, and having the low logical state in an active mode corresponding to read and write operations. In the power saving mode, signal SLPM having the high logical state causes PMOS transistor P1 to switch off so as to selectively decouple power supply node VDDHD from power supply node VDD such that power supply voltage VDDHD is present on power supply node VDDHD. In the active mode, signal BOOST having the high logical state causes PMOS transistor P1 to switch on so as to selectively couple power supply node VDDHD to power supply node VDD such that power supply voltage VDD is present on power supply node VDDHD. The presence on power supply node VDDHD of power supply voltage VDDHD lower than power supply voltage VDD decreases transistor leakage current levels in the power saving mode compared to the presence of power supply voltage VDD on power supply node VDDHD in the active mode.

In some embodiments, memory circuit 100 including booster circuit 150 is otherwise configured, e.g., by including an NMOS transistor and a signal complementary to signal SLPM instead of PMOS transistor P1 and signal SLPM, whereby power supply node VDDHD is decoupled from power supply node VDD during the power saving mode and coupled to power supply node VDD during the active mode.

In some embodiments, booster circuit 150 does not include PMOS transistor P1, and PMOS transistor P2 is configured to couple/decouple word line WLN[n] to/from power supply node VDD.

FIG. 3B depicts a number (N+1) of instances of each of word line WLN[n] represented as word lines WLN[0]-WLN[N], NMOS transistor N1, NAND gate G1, and PMOS transistor P1. Each instance of NMOS transistor N1 is configured to receive clock pulse signal CKPB, and each instance of NAND gate G1 is configured to receive clock pulse signal CKP.

Each instance of NAND gate G1 (connection not shown for clarity) and PMOS transistor P2 is coupled to a single instance of power supply node VDDHD, and a single instance of PMOS transistor P1 is configured to couple and decouple power supply node VDDHD to and from power supply node VDD. The single instance of PMOS transistor P1 is thereby configured to collectively couple/decouple word lines WLN[0]-WLN[N] to/from power supply node VDDHD through the corresponding instances of PMOS transistor P2.

Embodiments of booster circuit 150 which include a single instance of PMOS transistor P1 configured to collectively couple/decouple (N+1) word lines WLN[0]-WLN[N] to/from power supply node VDDHD require less area than an embodiment in which each instance of word line WLN[n] is coupled/decoupled to/from power supply node VDDHD through a corresponding instance of PMOS transistor P1.

In some embodiments, the number (N+1) of word lines WLN[0]-WLN[N] collectively coupled/decoupled to/from power supply node VDDHD though the single instance of PMOS transistor P1 is equal to the number of rows of the adjacent array 110, and booster circuit 150 includes a single instance of PMOS transistor P1. In some embodiments, the number (N+1) is equal to a fraction of the number of rows of the adjacent array 110, and booster circuit 150 includes a number of instances of PMOS transistor P1 corresponding to a product of the number (N+1) and the number of instances equal to the number of rows. In some embodiments, the number (N+1) is equal to the number M of clock pulse signals CKP_WL[m], e.g., four.

Figure 4:
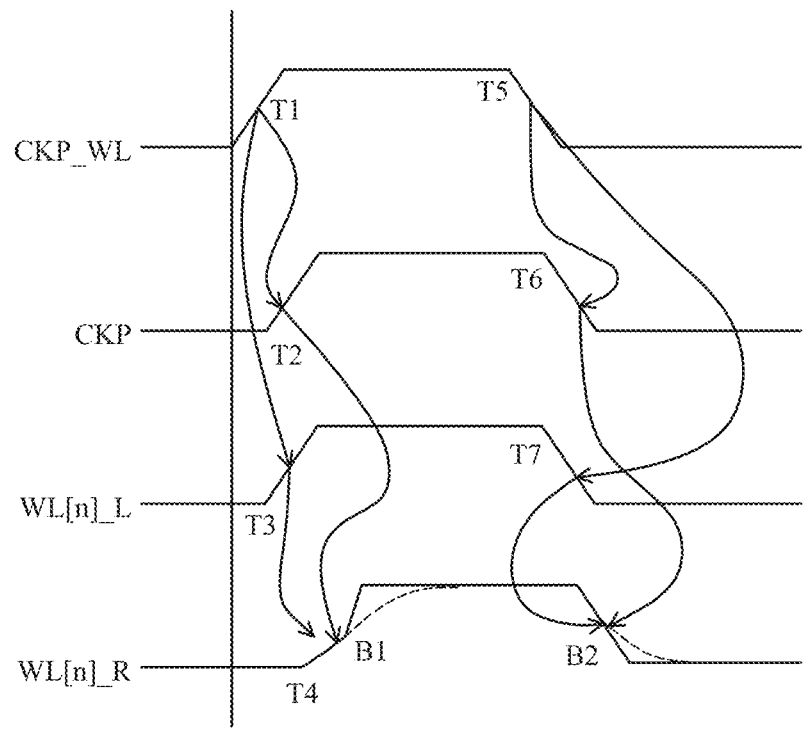
FIG. 4 is a diagram of memory circuit operating parameters, in accordance with some embodiments.

FIG. 4 is a diagram of memory circuit 100 operating parameters, in accordance with some embodiments. The parameters depicted in FIG. 4 are a non-limiting example presented for the purpose of illustration. In various embodiments, memory circuit 100 includes operating parameters other than those depicted in FIG. 4 whereby a word line signal is boosted at a second end opposite a first end, e.g., by including one or more signals complementary to those depicted in FIG. 4.

FIG. 4 includes clock pulse signals CKP_WL and CKP, each discussed above with respect to FIGS. 1-3B plotted over time (not labeled). FIG. 4 also includes a word line signal WL[n]_L corresponding to word line signal WL[n] generated by adjacent word line driver 130 at the first end of word line WLN[n] and a word line signal WL[n]_R corresponding to word line signal WL[n] generated by adjacent booster circuit 150 at the second end of word line WLN[n].

At the start of a read or write operation on word line WLN[n], each of clock pulse signals CKP_WL and CKP and signals WL[n] and WL[n]_R has the low logical state. At a time indicated by the vertical dashed line, local control circuit 120 generates a transition in a clock pulse signal CKP_WL[m] (not shown) associated with word line WLN[n], and thereby a transition T1 in clock pulse signal CKP_WL from the low logical state to the high logical state.

In response to the low-to-high logical state transition T1 in clock pulse signal CKP_WL received at inverter I1 of local I/O circuit 140, inverter I3 generates a low-to-high logical state transition T2 in clock pulse signal CKP. In response to the transition in clock pulse signal CKP_WL[m] received at the corresponding NAND gate of word line driver 130, the corresponding inverter of word line driver 130 generates a low-to-high logical state transition T3 in word line signal WL[n]_L.

The low-to-high logical state transition in word line signal WL[n]_L generates a low-to-high logical state transition T4 in word line signal WL[n]_R delayed by parasitic resistance and capacitance in word line WLN[n].

The combination of the low-to-high logical state transition T2 in clock pulse signal CKP and the low-to-high logical state transition T4 in word line signal WL[n]_R received at NAND gate G1 causes NAND gate G1 to further generate word line signal WL[n]_R having the high logical state, thereby boosting word line signal WL[n]_R at a point B1. Word line signal WL[n]_R boosted by booster circuit 150 thereby completes the transition to the high logical state before a word line signal in approaches in which word line signals are not boosted by a booster circuit, illustrated by the dashed line deviating from word line signal WL[n]_R at point B1.

At the end of the read or write operation on word line WLN[n], local control circuit 120 generates a transition T5 in clock pulse signal CKP_WL from the high logical state to the low logical state. The high-to-low logical state transition in clock pulse signal CKP_WL thereby causes inverter I3 of local I/O circuit 140 to generate a high-to-low logical state transition T6 in clock pulse signal CKP and the corresponding inverter of word line driver 130 to generate a high-to-low logical state transition T7 in word line signal WL[n]_L.

Either of the high-to-low logical state transition in clock pulse signal CKP or the high-to-low logical state transition in word line signal WL[n]_R received at NAND gate G1 causes NAND gate G1 to further generate word line signal WL[n]_R having the low logical state, thereby boosting word line signal WL[n]_R at a point B2.

The high-to-low logical state transition T5 in clock pulse signal CKP_WL also causes inverter I2 of local I/O circuit 140 to generate a low-to-high logical state transition in clock pulse signal CKPB (not shown), thereby switching on NMOS transistor N2, selectively coupling word line WLN[n] to reference node VSS such that word line signal WL[n]_R is further boosted to the low logical state at point B2.

Word line signal WL[n]_R boosted by booster circuit 150 thereby finishes the transition to the low logical state before a word line signal in approaches in which word line signals are not boosted by a booster circuit, illustrated by the dashed line deviating from word line signal WL[n]_R at point B2.

FIG. 5 is a diagram of address decoding scheme 500, in accordance with some embodiments. Address decoding scheme is a non-limiting example of an address decoding scheme used by memory circuit 100 to generate decode signals XA<0>-XA<7> and XB<0>-XB<7> and clock pulse signals CKP_WL[1]-CKP_WL[4] based on received row addresses including bits A<0>-A<7> as discussed above with respect to FIG. 2 and below with respect to FIG. 6.

In the embodiment depicted in FIG. 5, row address bits A<0> and A<1> correspond to clock pulse signals CKP_WL<1>-CKP_WL<4>, row address bits A<2>-A<4> correspond to row decode signals XA<0>-XA<7>, and row address bits A<5>-A<7> correspond to row decode signals AB<0>. AB<0>-AB<7>.

In operation, a received row address including bits A<0> and A<1> having the logical state configurations depicted in FIG. 5 thereby causes a local control circuit, e.g., local control circuit 120 discussed above with respect to FIGS. 1 and 2, to generate the corresponding ones of clock pulse signals CKP_WL[1]-CKP_WL[4]. The received row address including bits A<2>-A<4> having the logical state configurations depicted in FIG. 5 thereby causes the local control circuit to generate the corresponding ones of row decode signals XA<0>-XA<7>, and the received row address including bits A<5>-A<7> having the logical state configurations depicted in FIG. 5 thereby causes the local control circuit to generate the corresponding ones of row decode signals XB<0>-XB<7>.

Figure 6:
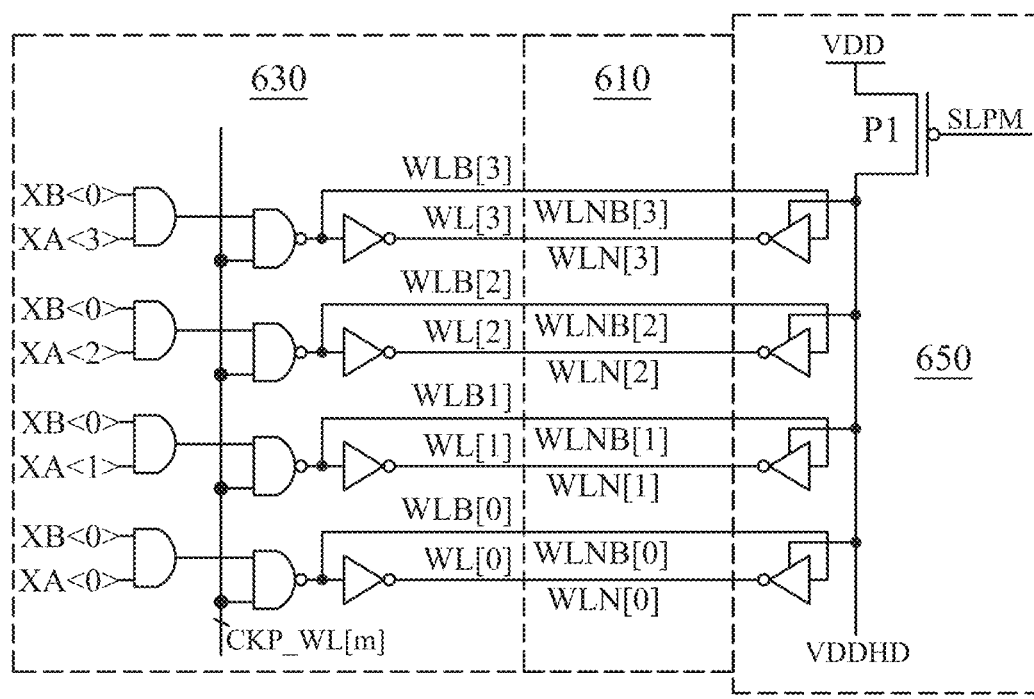
FIG. 6 is a diagram of a memory circuit, in accordance with some embodiments.

A memory circuit, e.g., memory circuit 100 discussed above with respect to FIGS. 1-4 or memory circuit 600 discussed below with respect to FIG. 6, is thereby capable of controlling activation of word lines WLN[n] using word line signals WL[n] such that the memory circuit is capable of realizing the benefits discussed herein with respect to memory circuits 100 and 600.

FIG. 6 is a diagram of a memory circuit 600, in accordance with some embodiments. FIG. 6 depicts a portion of memory circuit 600 including single instances of each of a word line driver 630, an array 610, and a booster circuit 650, and is simplified for the purpose of illustration. Memory circuit 600 is configured in the manner discussed above with respect to memory circuit 100 and FIGS. 1-4, and includes global control and I/O circuits and at least one instance of each of a local control and I/O circuit that are not depicted for the purpose of clarity.

Word line driver 630 includes pluralities of AND gates, NAND gates, and inverters configured as discussed above with respect to word line driver 130. Word line driver 630 further includes word lines WLNB[n], represented as word lines WLNB[0]-WLNB[3], coupled to the output terminals of each NAND gate. Word lines WLNB[n] are thereby configured to carry word line signals WLB[n], also referred to as word line bar signals WLB[n] in some embodiments, complementary to corresponding word line signals WL[n]. In operation, word line driver 630 is thereby configured to generate complementary word line signals WL[n] and WLB[n] on corresponding word lines WLN[n] and WLNB[n].

Array 610 includes word lines WL[n] and instances of memory cells MC (not shown) configured as discussed above with respect to array 110. Array 610 further includes word lines WLB[n] electrically isolated from word lines WL[n] and other elements of array 610. In operation, array 610 is thereby configured to propagate complementary word line signals WL[n] and WLB[n] from a first end of corresponding word lines WLN[n] and WLNB[n] adjacent to word line driver 630 to a second end of corresponding word lines WLN[n] and WLNB[n] adjacent to booster circuit 650.

Booster circuit 650 includes power supply node VDD configured to carry power supply voltage VDD, power supply node VDDHD configured to carry power supply voltage VDDHD, and PMOS transistor P1, each discussed above with respect to booster circuit 150. PMOS transistor P1 is coupled between power supply nodes VDD and VDDHD and includes the gate configured to receive signal SLPM such that booster circuit 650 is thereby configured to operate in power saving and active modes in the manner discussed above with respect to booster circuit 150.

Booster circuit 650 further includes a plurality of inverters (not labeled) coupled to power supply node VDDHD. Each inverter includes an input terminal coupled to a corresponding word line WLNB[n] and an output terminal coupled to a corresponding word line WLN[n]. A given inverter is thereby configured to, in operation, receive word line signal WLB[n] from word line WLNB[n] and boost word line signal WL[n] on the end of word line WLN[n] adjacent to booster circuit 650 based on word line signal WLB[n].

Memory circuit 600 including word line driver 630, array 610, and booster circuit 650 is thereby configured to, in operation, activate word line WL[n] at each of the two ends of word line WL[n], and is thereby capable of realizing the benefits discussed above with respect to memory circuit 100.

Compared to booster circuit 150 of memory circuit 100, booster circuit 650 of memory circuit 600 uses fewer components and thereby occupies less area. Because array 610 of memory circuit 600 includes word lines WLNB[n] in addition to word lines WLN[n] included in array 110 of memory circuit 100, memory circuit 600 requires greater routing resources than does memory circuit 100.

Figure 7:
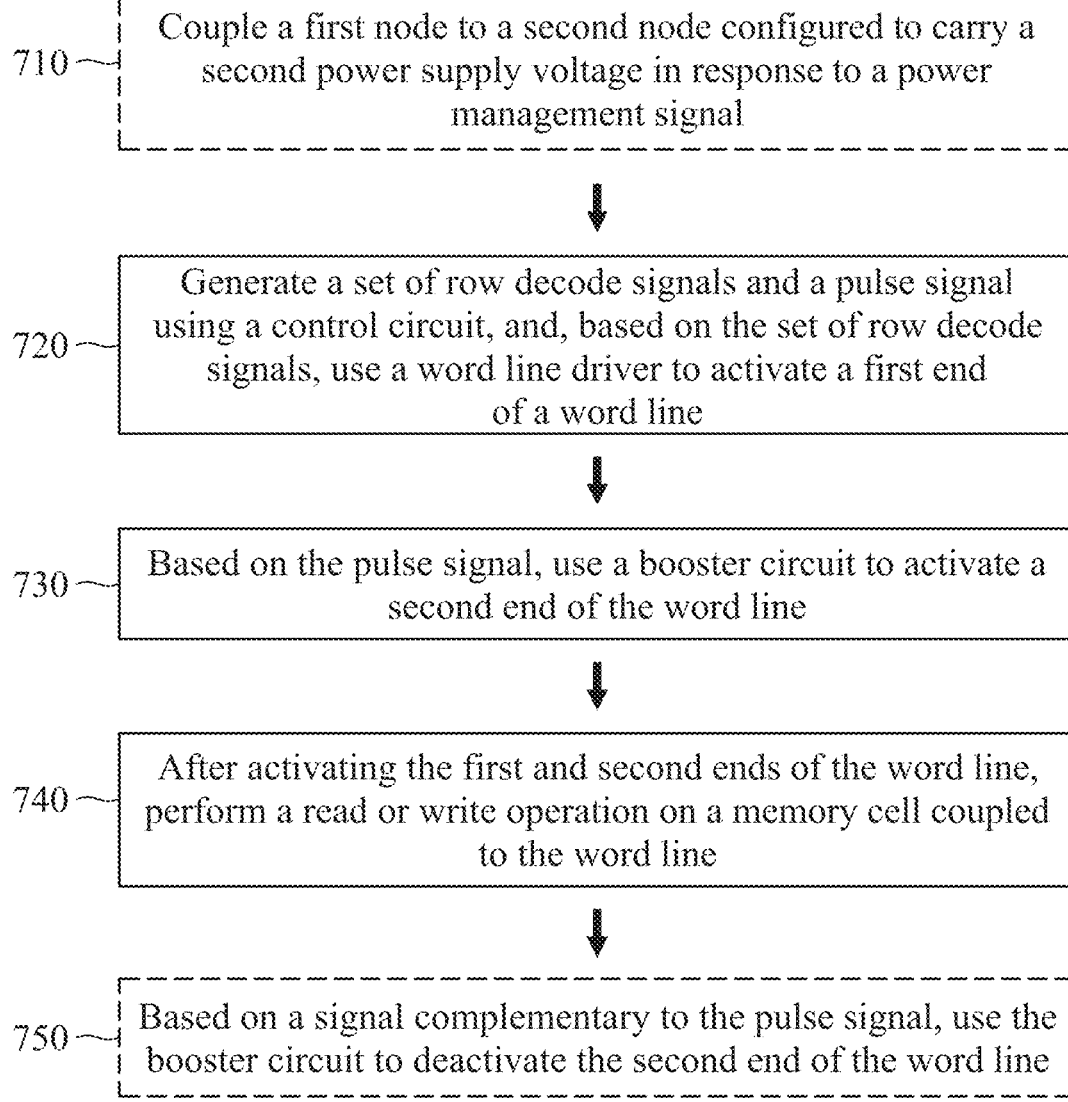
FIG. 7 is a flowchart of a method of transferring data in a memory circuit, in accordance with some embodiments.

FIG. 7 is a flowchart of a method 700 of transferring data in a memory circuit, in accordance with one or more embodiments. Method 700 is usable with a memory circuit, e.g., memory circuit 100 or 600, discussed above with respect to FIGS. 1-6.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, the operations of method 700 are a subset of operations of a method of operating a memory circuit.

At operation 710, in some embodiments, a first node is coupled to a second node configured to carry a second power supply voltage in response to a power management signal. In some embodiments, coupling the first node to the second node includes switching from a power saving mode to an active mode. In some embodiments, coupling the first node to the second node includes switching on a transistor coupled between the first and second nodes. In some embodiments, coupling the first node to the second node configured to carry the second power supply voltage in response to the power management signal includes switching on PMOS transistor P1, thereby selectively coupling power supply node VDDHD to power supply node VDD configured to carry power supply voltage VDD in response to signal SLPM as discussed above with respect to FIGS. 3A, 3B, and 6.

At operation 720, a set of row decode signals and a pulse signal are generated using a control circuit, and, based on the set of row decode signals, a word line driver is used to activate a first end of a word line. In some embodiments, generating the set of row decode signals and the pulse signal includes using local control circuit 120 discussed above with respect to FIGS. 1-4.

In some embodiments, generating the set of row decode signals and the pulse signal includes generating row decode signals XA<0>-XA<7> and XB<0>-XB<7> and one of clock pulse signals CKP_WL[1]-CKP_WL[4] based on received row addresses, as discussed above with respect to FIGS. 2-6. In some embodiments, generating the pulse signal includes generating clock pulse signal CKP_WL discussed above with respect to FIGS. 2-4.

In some embodiments, generating the set of row decode signals and the pulse signal includes using address decoding scheme 500 discussed above with respect to FIG. 5.

In some embodiments, using the word line driver to activate the first end of the word line includes using word line driver 130 to activate the first end of word line WLN[n] discussed above with respect to FIGS. 1-4 or using word line driver 630 to activate the first end of word line WLN[n] discussed above with respect to FIG. 6.

At operation 730, based on the pulse signal, a booster circuit is used to activate a second end of the word line. In some embodiments, using the booster circuit to activate the second end of the word line includes using booster circuit 150 discussed above with respect to FIGS. 1-4 or using booster circuit 650 discussed above with respect to FIG. 6.

In some embodiments, using the booster circuit to activate the second end of the word line includes coupling the word line to the first node configured to carry a first power supply voltage, e.g., using PMOS transistor P2 to couple word line WLN[n] to power supply node VDDHD as discussed above with respect to FIGS. 3A-4. In some embodiments, coupling the word line to the first node is in response to a boost signal generated in response to the pulse signal and activating the first end of the word line, e.g., in response to signal BOOST generated by NAND gate G1 in response to clock pulse signal CKP_WL and word line signal WL[n] as discussed above with respect to FIGS. 3A-4.

In some embodiments, using the booster circuit to activate the second end of the word line includes using an inverter to further generate the word line signal based on a complementary word line signal, e.g., using an inverter of booster circuit 650 to further generate word line signal WL[n] based on complementary word line signal WLB[n] as discussed above with respect to FIG. 6.

In some embodiments, activating the first and second ends of the word line of the plurality of word lines comprises generating a voltage on a single metal layer of the memory circuit, e.g., generating word line signal WL[n] on word line WLN[n] included in a single metal layer of memory circuit 100 as discussed above with respect to FIGS. 1 and 2.

At operation 740, after activating the first and second ends of the word line, a read or write operation is performed on a memory cell coupled to the word line. In some embodiments, performing the read or write operation on the memory cell coupled to the word line includes performing the read or write operation on memory cell MC coupled to word line WL[n] as discussed above with respect to FIGS. 1 and 6.

At operation 750, in some embodiments, based on a signal complementary to the pulse signal, the booster circuit is used to deactivate the second end of the word line. In some embodiments, using the booster circuit to deactivate the second end of the word line based on the signal complementary to the pulse signal includes using booster circuit 150 to deactivate the second end of word line WL[n] based on signal CKPB as discussed above with respect to FIGS. 2-4.

By executing the operations of method 700, data are transferred in and out of memory cells of a memory circuit by activating first and second ends of a word line, thereby obtaining the benefits discussed above with respect to memory circuits 100 and 600.

In some embodiments, a memory circuit includes a plurality of word lines, a word line driver coupled to the plurality of word lines and configured to output a first word line signal on a first word line of the plurality of word lines, and a booster circuit comprising a first node configured to carry a first power supply voltage, wherein the booster circuit is coupled to the plurality of word lines and configured to couple the first word line of the plurality of word lines to the first node responsive to a pulse signal and the first word line signal. In some embodiments, the first word line signal is one word line signal of a plurality of word line signals configured to activate corresponding word lines of the plurality of word lines, the word line driver is configured to generate the plurality of word line signals based on a plurality of row decode signals, and the memory circuit includes a local control circuit configured to generate the plurality of row decode signals and a local I/O circuit configured to generate the pulse signal corresponding to the word line driver activating any word line of the plurality of word lines. In some embodiments, a total number of word line signals of the plurality of word line signals corresponding to the pulse signal is equal to four. In some embodiments, the booster circuit includes a first transistor and a NAND gate, the first transistor is configured to couple the first word line to the first node responsive to a first signal, and the NAND gate is configured to generate the first signal responsive to the first word line signal and the pulse signal. In some embodiments, the booster circuit includes a second node configured to carry a second power supply voltage and a second transistor configured to couple the first node to the second node responsive to a power management signal. In some embodiments, the first word line signal is one word line signal of a plurality of word line signals configured to activate corresponding word lines of the plurality of word lines, and the booster circuit is configured to couple each word line of the plurality of word lines to the first node responsive to the pulse signal and the corresponding word line signal. In some embodiments, the booster circuit includes a reference node configured to carry a reference voltage and a transistor configured to couple the first word line to the reference node responsive to a signal complementary to the pulse signal. In some embodiments, the word line driver is positioned at a first end of each word line of the plurality of word lines, and the booster circuit is positioned at a second end of each word line of the plurality of word lines, the second end being opposite the first end. In some embodiments, the plurality of word lines is a first plurality of word lines, the memory circuit includes a second plurality of word lines coupled to the word line driver and the booster circuit and positioned between the word line driver and the booster circuit. In some embodiments, an entirety of each word line of the plurality of word lines is positioned within a single metal layer of the memory circuit.

In some embodiments, a method of transferring data in a memory circuit includes generating a set of row decode signals and a pulse signal using a control circuit, based on the set of row decode signals, using a word line driver to activate a first end of a word line, based on the pulse signal, using a booster circuit to activate a second end of the word line, and after the activating the first and second ends of the word line, performing a read or write operation on a memory cell coupled to the word line. In some embodiments, using the booster circuit to activate the second end of the word line includes coupling the word line to a first node configured to carry a first power supply voltage. In some embodiments, coupling the word line to the first node is in response to a boost signal generated in response to the pulse signal and the activating the first end of the word line. In some embodiments, the method includes coupling the first node to a second node configured to carry a second power supply voltage in response to a power management signal. In some embodiments, activating the first and second ends of the word line of the plurality of word lines includes generating a voltage on a single metal layer of the memory circuit. In some embodiments, the method includes using the booster circuit to deactivate the second end of the word line based on a signal complementary to the pulse signal.

In some embodiments, a memory circuit includes a first plurality of word lines, a word line driver coupled to the first plurality of word lines and positioned at a first end of the first plurality of word lines, and a first booster circuit coupled to the first plurality of word lines and positioned at a second end of the first plurality of word lines opposite the first end. The word line driver is configured to activate each word line of the first plurality of word lines responsive to a corresponding signal of a plurality of signals, and the booster circuit is configured to activate each word line of the first plurality of word lines responsive to the corresponding signal of the plurality of signals. In some embodiments, the word line driver is configured to generate the plurality of signals. In some embodiments, each of the word line driver and the booster circuit includes a plurality of inverters configured to receive the corresponding plurality of signals and active the corresponding first plurality of word lines responsive to the plurality of signals. In some embodiments, the circuit includes a second plurality of word lines, wherein the word line driver is coupled to the second plurality of word lines and positioned at a first end of the second plurality of word lines, and a second booster circuit coupled to the second plurality of word lines and positioned at a second end of the second plurality of word lines opposite the first end.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a plurality of word lines;
a word line driver coupled to the plurality of word lines and configured to output a first word line signal on a first word line of the plurality of word lines; and
a booster circuit comprising:
a first node configured to carry a first power supply voltage, and
a first transistor coupled to the first node,
wherein the booster circuit is coupled to the plurality of word lines, and the first transistor is configured to selectively couple the first word line of the plurality of word lines to the first node responsive to a pulse signal and the first word line signal.

2. The memory circuit of claim 1, wherein
the first word line signal is one word line signal of a plurality of word line signals configured to activate corresponding word lines of the plurality of word lines,
the word line driver is configured to generate the plurality of word line signals based on a plurality of row decode signals, and
the memory circuit further comprises:
a local control circuit configured to generate the plurality of row decode signals; and
a local input output (I/O) circuit configured to generate the pulse signal corresponding to the word line driver activating any word line of the plurality of word lines.

3. The memory circuit of claim 2, wherein a total number of word line signals of the plurality of word line signals corresponding to the pulse signal is equal to four.

4. The memory circuit of claim 1, wherein
the booster circuit further comprises a NAND gate,
the first transistor is configured to couple the first word line to the first node responsive to a first signal, and
the NAND gate is configured to generate the first signal responsive to the first word line signal and the pulse signal.

5. The memory circuit of claim 4, wherein the booster circuit further comprises:
a second node configured to carry a second power supply voltage; and
a second transistor configured to couple the first node to the second node responsive to a power management signal.

6. The memory circuit of claim 1, wherein
the first word line signal is one word line signal of a plurality of word line signals configured to activate corresponding word lines of the plurality of word lines, and
the booster circuit is configured to couple each word line of the plurality of word lines to the first node responsive to the pulse signal and the corresponding word line signal.

7. The memory circuit of claim 1, wherein the booster circuit further comprises:
a reference node configured to carry a reference voltage; and
a second transistor configured to couple the first word line to the reference node responsive to a signal complementary to the pulse signal.

8. The memory circuit of claim 1, wherein
the word line driver is positioned at a first end of each word line of the plurality of word lines, and
the booster circuit is positioned at a second end of each word line of the plurality of word lines, the second end being opposite the first end.

9. The memory circuit of claim 8, wherein
the plurality of word lines is a first plurality of word lines, and
the memory circuit comprises a second plurality of word lines coupled to the word line driver and the booster circuit and positioned between the word line driver and the booster circuit.

10. The memory circuit of claim 1, wherein an entirety of each word line of the plurality of word lines is positioned within a single metal layer of the memory circuit.

11. A method of transferring data in a memory circuit, the method comprising:
generating a set of row decode signals and a pulse signal using a control circuit;
based on the set of row decode signals, using a word line driver to activate a first end of a word line;
based on the pulse signal, using a booster circuit to activate a second end of the word line; and
after the activating the first and second ends of the word line, performing a read or write operation on a memory cell coupled to the word line.

12. The method of claim 11, wherein the using the booster circuit to activate the second end of the word line comprises coupling the word line to a first node configured to carry a first power supply voltage.

13. The method of claim 12, wherein the coupling the word line to the first node is in response to a boost signal generated in response to the pulse signal and the activating the first end of the word line.

14. The method of claim 12, further comprising coupling the first node to a second node configured to carry a second power supply voltage in response to a power management signal.

15. The method of claim 11, wherein the activating the first and second ends of the word line comprises generating a voltage on a single metal layer of the memory circuit.

16. The method of claim 11, further comprising using the booster circuit to deactivate the second end of the word line based on a signal complementary to the pulse signal.

17. A memory circuit comprising:
a first plurality of word lines;
a word line driver coupled to the first plurality of word lines and positioned at a first end of the first plurality of word lines; and
a first booster circuit coupled to the first plurality of word lines and positioned at a second end of the first plurality of word lines opposite the first end,
wherein
the word line driver is configured to activate each word line of the first plurality of word lines responsive to a corresponding signal of a plurality of signals, and
the first booster circuit is configured to activate each word line of the first plurality of word lines responsive to the corresponding signal of the plurality of signals.

18. The memory circuit of claim 17, wherein the word line driver is configured to generate the plurality of signals.

19. The memory circuit of claim 17, wherein each of the word line driver and the booster circuit comprises a plurality of inverters configured to receive the corresponding plurality of signals and active the corresponding first plurality of word lines responsive to the plurality of signals.

20. The memory circuit of claim 17, further comprising:
a second plurality of word lines, wherein the word line driver is coupled to the second plurality of word lines and positioned at a first end of the second plurality of word lines; and
a second booster circuit coupled to the second plurality of word lines and positioned at a second end of the second plurality of word lines opposite the first end.

* * * * *